United States Patent
Wu et al.

(10) Patent No.: US 6,245,594 B1
(45) Date of Patent: *Jun. 12, 2001

(54) METHODS FOR FORMING CONDUCTIVE MICRO-BUMPS AND RECESSED CONTACTS FOR FLIP-CHIP TECHNOLOGY AND METHOD OF FLIP-CHIP ASSEMBLY

(75) Inventors: Zhiqiang Wu, Meridian; Tongbi Jiang; Salman Akram, both of Boise, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/906,297

(22) Filed: Aug. 5, 1997

(51) Int. Cl.[7] .................................................. H01L 21/44
(52) U.S. Cl. ........................ 438/108; 438/110; 438/613; 438/672
(58) Field of Search ..................... 438/108, 612, 438/613, 672, 626, 666, 692, 106, 110, 614; 257/692, 737, 774, 778, 780; 228/180.22

(56) References Cited

U.S. PATENT DOCUMENTS

| | | | |
|---|---|---|---|
| 3,811,186 | 5/1974 | Larnerd et al. | 29/626 |
| 4,182,781 | 1/1980 | Hooper et al. | 427/90 |
| 4,922,321 | * 5/1990 | Arai et al. | 257/752 |
| 4,940,181 | 7/1990 | Juskey, Jr. et al. | 228/180.2 |
| 5,019,673 | 5/1991 | Juskey et al. | 174/52.2 |
| 5,084,407 | * 1/1992 | Boland et al. | 438/692 |
| 5,173,442 | * 12/1992 | Carey et al. | 438/620 |
| 5,246,880 | * 9/1993 | Reele et al. | 438/613 |
| 5,329,423 | 7/1994 | Scholz | 361/760 |
| 5,346,857 | 9/1994 | Scharr et al. | 438/125 |
| 5,445,994 | 8/1995 | Gilton | 438/125 |
| 5,451,551 | * 9/1995 | Krishnan et al. | 438/626 |
| 5,473,197 | * 12/1995 | Idaka et al. | 257/786 |
| 5,477,086 | 12/1995 | Rostoker et al. | 257/737 |
| 5,480,835 | 1/1996 | Carney et al. | 438/614 |
| 5,492,235 | 2/1996 | Crafts et al. | 216/13 |
| 5,505,367 | 4/1996 | Degani et al. | 228/248.1 |
| 5,508,228 | 4/1996 | Nolan et al. | 438/614 |
| 5,565,379 | * 10/1996 | Baba | 438/656 |
| 5,600,180 | * 2/1997 | Kusaka et al. | 257/692 |
| 5,658,829 | * 8/1997 | Mathews et al. | 438/656 |
| 5,764,119 | * 6/1998 | Miyagi et al. | 361/767 |
| 5,851,915 | * 12/1998 | Miyakawa | 438/666 |

OTHER PUBLICATIONS

Yamada, H., et al., *A fine pitch and high aspect ratio bump array for flip–chip interconnection*, 1992 IEEE/CHMT Int'l Electronics Manufacturing Technology Symposium, pp. 288–291.

Lau, J., *Chip on Board Technologies for Multi–Chip Modules*, 1994, pp. 240–247.

*Interconnect to Offer High Density Alternative*, Electronic Packaging & Production, Industry News, Jun. 1996, p. 11.

* cited by examiner

Primary Examiner—Olik Chaudhuri
Assistant Examiner—Alonzo Chambliss
(74) Attorney, Agent, or Firm—TraskBritt

(57) ABSTRACT

A flip-chip semiconductor die assembly is provided with discrete projecting connective elements on the die and mating recessed contacts on the substrate, together forming a plurality of electrical, mechanical, and thermal connections between the die and substrate. The element and recess provide a self-aligning feature. Compared to the prior art, a less costly, simpler method for forming the element and recess is provided, which method requires fewer process steps, uses less raw materials, and generates less waste. The method allows for placement of fine-pitch connective elements and precise control of element size and height.

64 Claims, 4 Drawing Sheets

METHODS FOR FORMING CONDUCTIVE MICRO-BUMPS AND RECESSED CONTACTS FOR FLIP-CHIP TECHNOLOGY AND METHOD OF FLIP-CHIP ASSEMBLY

BACKGROUND OF THE INVENTION

1. Field of the Invention

The present invention pertains to a flip-chip semiconductor die assembly and, more particularly, to micro-size bumps and recessed contacts for self-aligned contact of the die to a substrate, and specifically to methods for forming the bumps and mating contacts.

2. State of the Art

As the complexity of integrated circuits on semiconductor dice has increased, semiconductor die manufacturers and assemblers have found a correspondingly increased need for improved input and output connections. A flip-chip arrangement is one conventional arrangement used to take advantage of its potentially higher number of arrayed input and output connections; that is, more such connections can be placed on the active surface of a die than with wire-bonding, TAB, or other conventional connection techniques. In a conventional wire bonded arrangement, the number of connections that can exist in a given surface area of a die is limited because of the diameter of the wire ball to be formed from the bond wire at the connection point or bond pad on the die surface, as well as by the number of wires which can be extended from bond pads to a lead frame or carrier substrate without shorting. The pitch, or nominal distance between the center of any two connection points, is generally limited to approximately 0.1 mm, although some arrangements have achieved a pitch of as low as 0.08 mm. Simply put, the wire balls are too bulky to allow a more dense array of connections, and potential mutual interference by the wires limits the usable patterns of such connections.

By contrast, a conventional solder-bumped flip-chip arrangement allows a high density of connections per given area of active surface on the die, and the least amount of die-to-carrier connection time because of the ability to effect all connections simultaneously. In a conventional flip-chip arrangement, solder bumps are formed or deposited on a semiconductor die, and the die ("chip") is turned over, i.e. flipped, and then aligned with mirror-image solder bumps or bond pads on another die, or terminal pads of a die carrier or a printed circuit board or other, similar carrier substrate. By reflowing the solder after contact of the bumps with the pads or cooperating bumps on the mating component of the assembly being fabricated, a simultaneous electrical, mechanical, and thermal connection of each cooperating pair of contact points is achieved. Since bump size can, with some techniques, be smaller than wire ball size and bumps can, in some instances, be placed more accurately than wire balls, the potential density of bumps can exceed that of wire bonds, reaching a corresponding pitch of as low as 0.01 mm. Nevertheless, bump pitch is limited by the selection of bump size, bump shape, and bond pad metallization characteristics. As detailed below, when an improper combination of these elements is selected, the bumps may spread outward too far and form unwanted connections to other bond pads during reflow of the solder.

One of the first solder-bumped flip-chip arrangements was created using so-called Controlled Collapse Chip Connection (C4) technology. The technology involves, first, laying down a passivation layer on the surface of a semiconductor die which covers the bond pads where connections will be made between the die and a substrate. Next, holes are formed in the passivation layer over the bond pads and one or more layers of metallization are typically deposited over the exposed bond pads. Finally, solder bumps (typically of a tin/lead alloy, although other alloys are sometimes employed) are deposited on the metallized areas and a preliminary reflow performed so that the bumps take on a semi-spherical shape. Later, after alignment with terminal pads of conductive traces of a substrate, a final reflow will form the permanent die-to-substrate electrical connections. The metallization deposited on each bond pad must be limited in circumference to the approximate size of the hole through which it contacts the bond pad. However, the metallization may extend up the walls of the hole in the passivation layer through which the bond pad is exposed, and onto the top surface of the passivation layer, although obviously avoiding contact with neighboring bond pad metallization.

One purpose of the metallization layer interconnecting the bump and the bond pad on the underlying active surface of the die is to provide improved solder adhesion to the bond pad. Another purpose is to control the contact area the bump will cover on the die surface by use of a very solder-wettable metal or alloy on the exposed surface of the metallization. The intent is to prevent the solder from spreading beyond the circumference of the deposited metallization. By controlling the contact area, the metallization partially controls the bump's height, since the bump will form a semi-sphere with a size somewhat dependent on the circumference of the metallized area on which it resides, as well as on the volume of the bump material. Understandably then, the metallized area is sometimes referred to as Ball-Limiting Metallurgy (BLM). If the volume of deposited solder becomes too large for a given contact area metallization, then the surface tension of the particular solder composition used will be insufficient to contain the molten solder in spherical form and the solder will overflow the metallization despite its presence. Even if the surface of the die is additionally coated with a low-surface tension material to inhibit spreading of the reflowed solder from the BLM, the effectiveness of such coatings is limited. The coating will probably help prevent incidental outflows from the BLM, unless a bump is too large and exceeds the surface tension of the molten solder. In that case, a low-surface tension coating will probably be insufficient to contain all of the escaping solder and avoid contact with another bond pad located nearby in a fine-pitch array. Thus, bump volume and pitch must be carefully considered and controlled to prevent defects in flip-chip connections.

The use of solder bumps to form connections between two dice, a die and a printed circuit board or other carrier substrate, or a carrier substrate and a higher-level package is well-known in the art. However, even though BLM is used on components of such assemblies carrying the solder bumps, the spacing or "pitch" of the bumps is limited by conventional technologies due to problems with preventing the bumps from flowing together during reflow of the solder. Many variations in the materials used in a C4 process and in the detailed process steps exist, since users have sought to match the technology to their particular applications, to meet reliability requirements, and to improve production efficiency and connection quality. The significant number of these variations is indicative of the complexity of conventional methods for forming solder bumps on dice and the number of problems inherent in the conventional methods. The complexity of forming adequate solder bump connections is further exemplified by the methods disclosed in U.S.

Pat. Nos. 4,940,181; 5,477,086; 5,480,835; 5,492,235 and 5,505,367. The complexity of such methods contributes to the typical, relatively high cost of manufacturing solder-bumped dice, particularly as attempts are made to form smaller bumps with hopes to achieve a more densely-packed array of connections.

After forming bumps on a semiconductor die, the die must then typically be connected to another die, or to a printed circuit board or other carrier substrate. As indicated earlier, the die bumps are aligned with mirror-image terminal pads or solder bumps on the substrate to make the connection. Substrate bumps may generally be formed by the same methods used to form die bumps. However, the substrate bumps often possess a designed shape so as to facilitate aligning of the die bumps and making a reliable connection. In some instances, bumps of metals other than solder are employed, and connections are effected by means other than a reflow. In addition, metal-loaded polymer bumps have also been fabricated. See, for examples of the foregoing structures, U.S. Pat. Nos. 4,182,781; 5,246,880; 5,329,423; 5,346,857 (all non-solder metal bumps) and 5,508,228 (metallized compliant polymer bumps). Self-aligning connections may be desirable, and exemplary shapes previously designed for this approach are illustrated in U.S. Pat. Nos. 4,940,181; 5,019,673; 5,329,423 and 5,477,086. Absent designing a substrate bump or terminal pad with some sort of conforming shape wherein a projecting die bump can reside and, thus, self-align, highly accurate mechanical pre-reflow alignment of the die to the substrate must be achieved by another method. Thereafter, all the bumps on the die and cooperating contact areas on the substrate must be brought into relatively exact contact with one another and maintained in that position during both reflow and re-solidification of the solder. Because of the surface tension changes and capillary action that occurs during reflow and re-solidification of the solder bumps, maintaining a die in its proper position relative to a substrate may be more difficult than it first appears, particularly if some of the intended connection points are even slightly misaligned, which in turn tends to induce misalignment of other connection points due to the surface tension and capillary action of the solder material.

Given the added manufacturing cost of forming specially designed substrate bumps to match the shape of die bumps, some manufacturers have developed less costly self-alignment methods. For example, as disclosed in U.S. Pat. No. 3,811,186, spacers may be disposed between the die bumps such that the spacers nearly exactly occupy the gap between bumps. By using specifically-placed spacers of insulating material which may exceed the combined height of aligned die and substrate bumps, when the die and the substrate are brought into alignment and the assembly heated, the spacers will soften and reduce in height, permitting contact and fusion of the bumps in an aligned manner. When the assembly cools, the spacers will return to their normal height, elongating the fused, aligned bump connections. Attempts have also been made, as in U.S. Pat. No. 5,508,228, to eliminate the crucial need for self-alignment by using non-conductive adhesives surrounding the connection points to join metallized, compliant polymer bumps of a die to contact points on a substrate rather than relying on a solder bond. Additionally, bumps formed from conductive paste, as in U.S. Pat. No. 5,246,880, rather than solder, have been used to produce a higher aspect ratio bump than can be achieved with solder, and a bump of more precise and repeatable height. However, formation of a conductive paste bump according to the '880 process will generally take longer than formation of a solder bump, since the bump is "built" in a plurality of layering steps, and the paste curing time exceeds solder re-solidification time.

See also U.S. Pat. No. 5,445,994, assigned to the assignee of the present invention, for a disclosure of forming planar bond pad connectors by patterning a passivation layer with holes by using an overlying patterning layer of a dielectric material, etching holes down to bond pads on the die, filling the holes with a metal layer, and planarizing the metal layer to an endpoint within the patterning layer over the passivation layer.

Insofar as solder bumps become semi-spherical in shape when heated to a liquid state, an increase in the desired height of bumps will result in a decrease in the potential density of a bump array, as an increase in height of a semi-spherical bump necessarily results in an increased bump width. Taller, more slender bumps (the term "slender" indicating a bump height measurably more than the bump width, or an aspect ratio of height to width of greater than 1) of columnar or pillar configuration are desirable for two significant reasons. First, with relatively slender bumps for a given gap or clearance between the die and the substrate, more bumps can be disposed on the die without inadvertent lateral connection between bumps during solder reflow. Second, thermal expansion of the die and/or the substrate creates stresses which the solder bump connections will bear. A "fat" semi-spherical-shaped solder connection will not be able to endure as much flex and strain as a slender solder connection of equal height. Flex and strain capacity of solder connections becomes particularly important when a silicon semiconductor die has a significantly different coefficient of thermal expansion (CTE) than its corresponding carrier substrate. Under such circumstances, the substrate will typically have a larger CTE, and will thus expand and contract during heating and cooling cycles to a greater degree than the die, creating substantial stress in the solder connections.

To the inventors' knowledge, those of ordinary skill in the art have failed to develop a relatively simple and cost-effective method for forming discrete connective elements, such as pillars or bumps, on a die, and mating recesses on a substrate. Furthermore, even the most simple methods in the art fail to yield both a self-aligning feature and a dense array of sufficiently slender connective elements.

SUMMARY OF THE INVENTION

According to the present invention, a semiconductor die and a substrate are provided with a number of discrete, projecting connective elements on either the die or the substrate, and a like number of respectively aligned mating recessed contacts in the other. When joined, the projecting elements and cooperating recessed contacts form a plurality of discrete electrical, mechanical, and thermal connections between the die and substrate. The structure of the projecting elements and mating recessed contacts is such that the die and substrate possess a self-aligning feature, similar to a plug-and-socket design. The projecting element or plug is preferably pillar-shaped and slender, with a relatively high aspect ratio, greater than 1. However, the present invention is not limited to a particular connective element aspect ratio (again, structure height÷structure width). An array of elements and recesses can be formed according to the invention with a pitch as small as or smaller than prior art flip-chip die-to-substrate connections because the connective element or "plug" need not possess a semi-spherical shape with its attendant closely-related height and width.

The present invention further includes a simple method, in comparison to the prior art, for forming a projecting connective element and mated recess using etch back technology, in one variation in combination with abrasive planarization. The simplicity of the method decreases the typical cost of forming flip-chip connections by decreasing the number of process steps and the volume of manufacturing materials required, such as etchants, electroplating solutions, and resist layers. Also, the present invention may be applied at the wafer-scale, multiple die, or single die level. As used herein "wafer scale" is not limited to traditional wafers but encompasses any semiconductive material layer on which a large plurality of discrete active devices may be fabricated, including without limitation silicon-on-insulator (SOI) and silicon-on-sapphire (SOS) structures.

In its basic form, the method of the invention involves patterning holes in the passivation layer of a die to expose underlying bond pads, depositing solder or conductive epoxy over the passivation layer and into the holes, removing the solder or epoxy layer to a level which re-exposes the passivation layer upper surface and substantially coplanar tops of the conductive material in the holes, and partially etching back the passivation layer to cause the conductive material to project as connective elements formed in the previously patterned holes and cause them to project from the remainder of the passivation layer.

Although not a most preferred embodiment, at this point in the process, a functional conductive element arrangement exists wherein the die may be flipped over, the projecting elements placed in contact with a mating arrangement of substrate terminal pads and attached thereto by reflowing the element (if solder) or curing the element (if conductive epoxy), or using a conductive adhesive to bond the projecting element to the terminal. Also, the projecting elements could be formed on the substrate instead of the die, and contact made with bond pads of the die.

However, the invention preferably involves patterning holes in a passivation layer deposited on a substrate to expose terminals thereon, depositing solder or conductive epoxy on the passivation layer and into the holes over the terminal surfaces, removing the solder or epoxy to a level which re-exposes the upper surface of the passivation layer, and partially etching back the solder or conductive epoxy in the holes over the terminal surface to form recessed contacts. Solder or epoxy pads will thus remain on the terminals at the bottom of the recesses to facilitate electrical, mechanical, and thermal connection to projecting connective elements formed on a die.

It will be understood that the term "conductive epoxy", as used herein, includes both inherently-conductive epoxy compounds as well as epoxies filled with discrete conductive particles, and that the term "epoxy" is employed as a generic term encompassing all suitable adhesives, including thermosetting adhesives, thermoplastic adhesives, "B" stage adhesives employing a pre-cure step, and so-called "snap cure" adhesives.

The features and advantages of the present invention mentioned above, as well as others, will be readily understood by reading the following description in conjunction with the accompanying figures, wherein like reference numerals have been applied to designate like elements throughout the several views.

DESCRIPTION OF THE PREFERRED EMBODIMENTS

Figure 1:
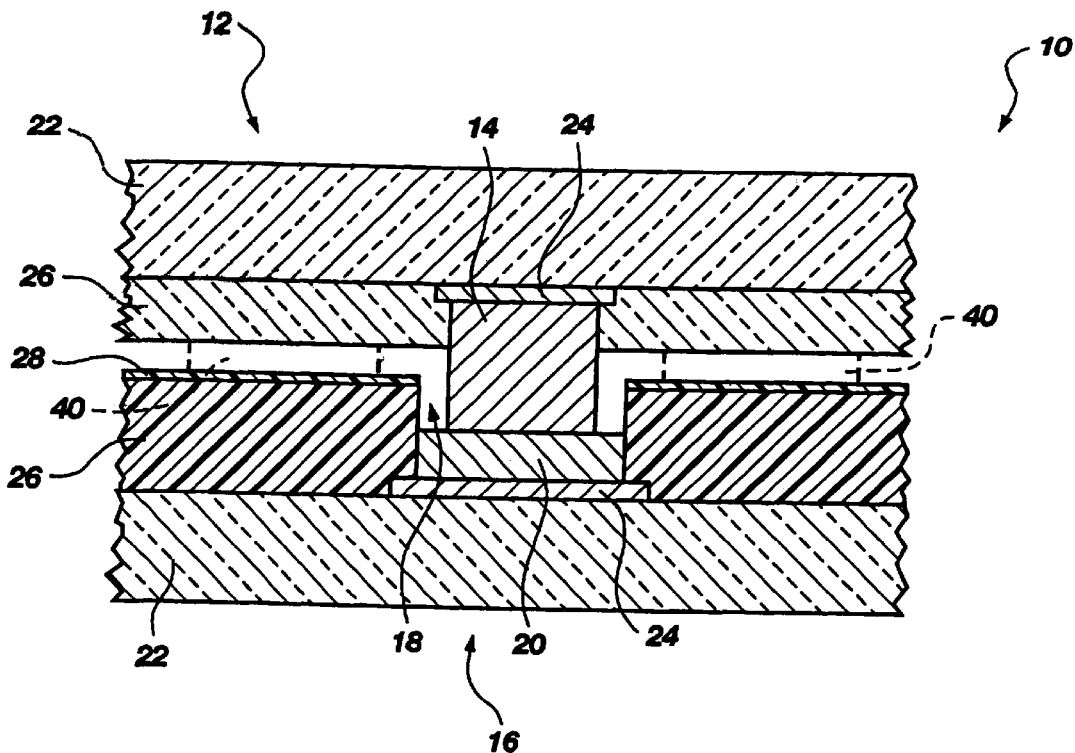
FIG. 1 is a cross-sectional view of one preferred embodiment of a flip-chip semiconductor die assembly according to the present invention.

A first embodiment of a flip-chip semiconductor die, multiple die or wafer assembly 10 with a self-aligned contact to its carrier substrate 16 is shown in FIG. 1. The semiconductor die 12 is provided with at least one discrete projecting connective element 14 of solder or conductive epoxy and the carrier substrate 16 is provided with at least one mating recess 18, wherein is deposited a connective or contact pad 20, also of solder or conductive epoxy, depending on the material of projecting connective element 14. The substructure 22 upon which the bond pad 24 and passivation layer 26 is formed is shown generically in FIG. 1 for both the semiconductor die 12 and carrier substrate 16, it being understood that die substructure 22 comprises a substrate of semiconductive material carrying integrated circuit devices on its active surface, while carrier substrate substructure 22 may comprise a semiconductor material, ceramic, glass fiber, molybdenum, or other suitable substrate material known in the art. The passivation layer 26 is also shown generically for both the semiconductor die 12 and carrier substrate 16, except that an overlayer 28 of low surface tension material such as a polyimide, which has critical surface tension at 44 dynes/cm, is shown on the passivation layer 26 of the carrier substrate 16. As discussed earlier, providing a proper overlayer 28 is one measure which will help control unwanted solder spread during the connecting reflow.

Figure 2:
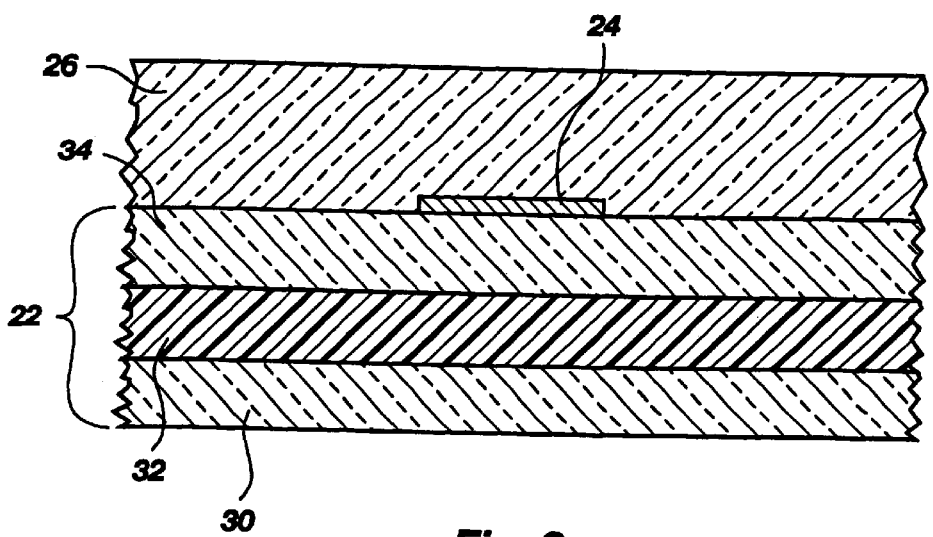
FIG. 2 is a cross-sectional view of either a die or a substrate at the beginning of step one of the method for forming the die or the substrate in the assembly of FIG. 1.

In practice, the substructure 22 would be multi-layered. For example, as shown in FIG. 2, the substructure 22 of an exemplary die could comprise a silicon or other semiconductor base layer 30 with integrated circuit (IC) features 32 formed thereon and an inter-layer dielectric (ILD) coating 34 formed on the IC features. In practice, the passivation layer 26 could also be multi-layered and consist of single or multiple layers selected from the group comprising silicon dioxide, silicon-based glass such as phosphorous silicate glass (PSG) or borophosphorous silicate glass (BPSG), silicon nitride, polyimides, photoresists, and other conventional passivation materials. Myriad combinations of layers in the substructure and passivation of a die or substrate are envisioned within the present invention since it is useful in forming connections between a wide variety of devices, such as two dice, a die and an adapter-type carrier, a die and a conventional planar substrate such as a printed circuit board, and a die carrier. Additionally, forming the projecting connective element 14 on the carrier substrate 16 rather than the semiconductor die 12 with the mating recess 18 in the semiconductor die 12 is envisioned within the present invention.

In FIG. 1, the wafer assembly 10 is shown with the semiconductor die 12 in alignment with the carrier substrate 16 preliminary to a permanent electrical, mechanical, and thermal connection being formed therebetween. That is, a complete connection could be effected by reflowing (solder) or curing (epoxy) the projecting connective element 14 and contact pad 20 or by using an interposed conductive adhesive to join the projecting connective element 14 and contact pad 20. The element and pad may be formed from a conventional Pb/Sn solder of a composition suited to the particular flip-chip assembly or from a thermoplastic-type or thermosetting-type of conductive or conductor-filled epoxy which is capable of reflow to effect connection. A so-called "B stage" epoxy, which is partially curable after deposition to maintain its shape, and then subsequently fully cured or set to effect an adhesive bond, may also be employed. Also, as previously mentioned, a "snap" cure adhesive with a cure time measured in seconds is also contemplated as usable. Conductive fillers for epoxy known in the art include silver particles and polystyrene balls coated with nickel. It is preferred that the conductive filler particles be of silver and employed in a high percentage by weight to maximize conductivity, minimize impedance and increase the viscosity of the conductive epoxy for enhanced definition of the connective elements. It is preferred that the connection elements, if formed of epoxy, comprise at least fifty percent (50%) by weight silver conductive filler material. It is also preferred that the filler particles be of relatively small size in comparison to those employed in the prior art, for example in the size range of about 0.05 to 0.1 $\mu$m, to provide more inter-particle conductive surface area contact and effect a better electrical connection between the bond pads and the terminals. Alternatively, the element and pad may be formed from a non-reflowable, non-adhesive conductive material, provided that another conductive or conductor-filled adhesive interposed between the element and pad is used to effect the connection. While use of a recessed contact pad 20 is preferred, the present invention will still operate in its absence to effect a direct connection between the projecting connective element 14 and its associated bond pad 24.

Figure 3:
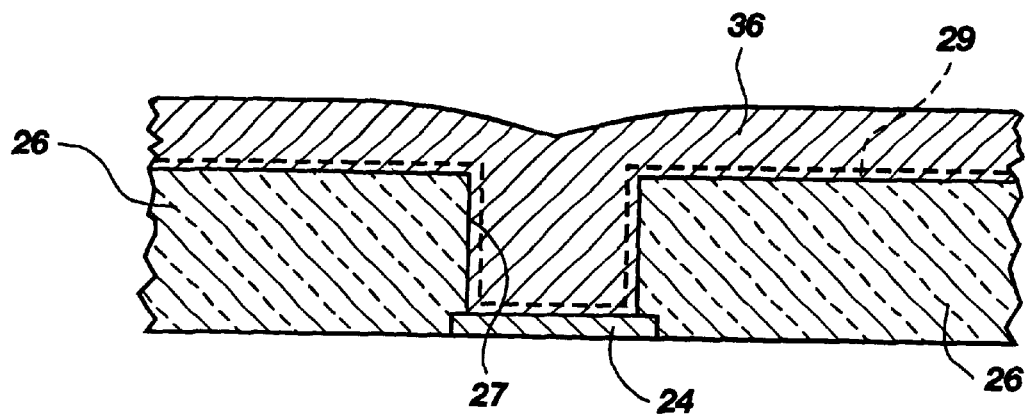
FIG. 3 is a cross-sectional view of either a die or a substrate at the end of step two of the method for forming the die or the substrate in the assembly of FIG. 1.
Figure 4:
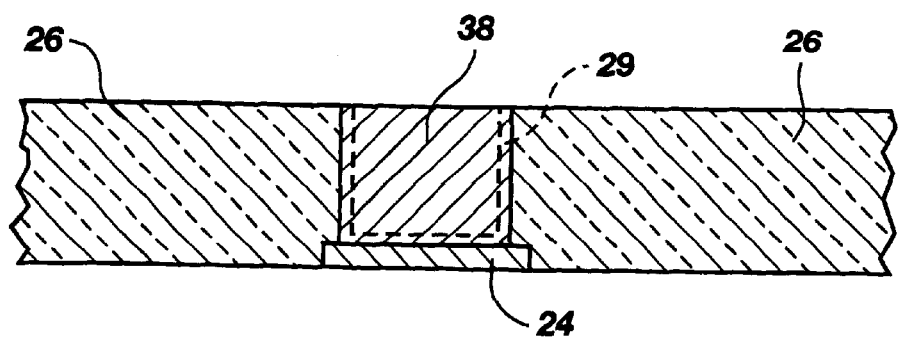
FIG. 4 is a cross-sectional view of either a die or a substrate at the end of step three of the method for forming the die or the substrate in the assembly of FIG. 1.
Figure 5:
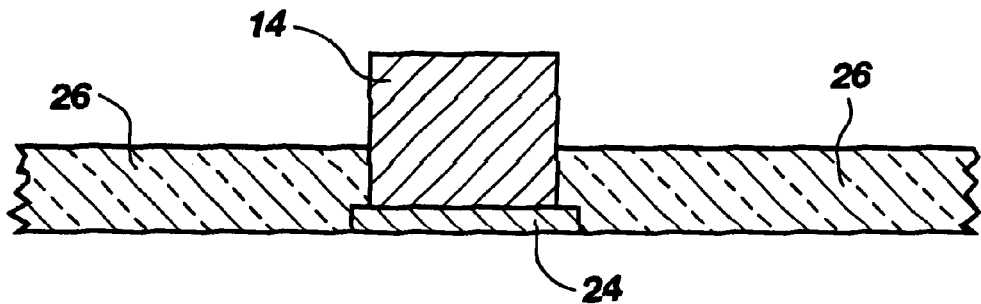
FIG. 5 is a cross-sectional view of a connective element at the end of step four of the method for forming the element in the assembly of FIG. 1.
Figure 6:
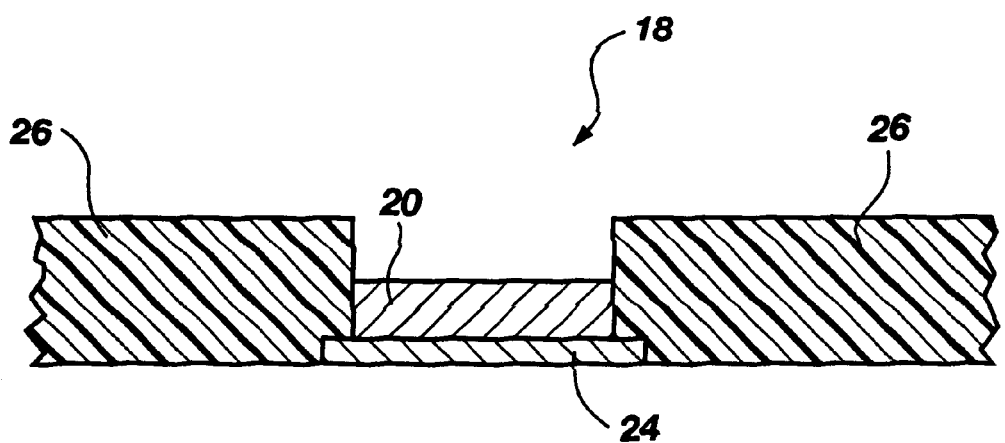
FIG. 6 is a cross-sectional view of a mating recess at the end of step four of the method for forming the recess in the assembly of FIG. 1.

The present invention includes a simple four-step method for forming the projecting connective element on a die or substrate as discussed above, or for forming the mating recessed contact pad discussed above on the other mating component (such as a carrier substrate) of the proposed assembly. The process begins with a die or substrate as shown in FIG. 2 wherein the semiconductor base layer 30, IC features 32, if any, ILD coating 34, if any, bond pad or terminal pad 24, and passivation layer 26 are already provided. The passivation layer 26, preferably of a thickness of 4 kA to 2 $\mu$m, is patterned using conventional methods to form an aperture or hole 27 therethrough to expose the bond pad 24. As shown in FIG. 3 in broken lines, an optional intermediate conductive layer 29 may be deposited by techniques known in the art prior to conductive layer 36 to improve adhesion of conductive layer 36 to bond pad or terminal pad 24 and/or to provide a stop layer for subsequent chemical mechanical planarization (CMP) as discussed below. Intermediate conductive layer 29 may be applied before or after formation of hole 27, as desired, depending upon whether enhanced adhesion of the material of passivation layer 26 to bond pad or terminal pad 24 is desired. Next, a solder or conductive epoxy stop layer 36 is deposited on the passivation layer 26 and into hole 27, as shown in FIG. 3, preferably using conventional methods such as sputtering, chemical vapor deposition (CVD) or wave soldering techniques in the case of solder, and spin coating in the case of a conductive epoxy. Alternatively, other less-preferred conventional methods, such as spray coating or roll-on coating, may be used to deposit the conductive layer 36. In the case of a solder or other heat-softenable conductive material stop layer 36, a pre-reflow heating may optionally be effected to eliminate voids in the stop layer and ensure complete filling of hole 27. In the next step, as shown in FIG. 4, the conductive layer 36 (and optional layer 29, if employed) is substantially uniformly removed to re-expose the passivation layer 26 by using conventional methods such as abrasive or "mechanical" planarization, "chemical-mechanical" planarization (CMP), or plasma etching. Upon removal of the upper portion of the conductive layer 36 to the level of the upper surface of the passivation layer 26, a conductive solder or epoxy accumulation 38 will remain in the now-filled aperture or hole 27 previously created, with the top of the conductive accumulation 38 being substantially co-planar with the upper surface of passivation layer 26. Forming a projecting connective element 14 involves partially etching back the passivation layer 26 to the exclusion of the solder or epoxy accumulation 38 using conventional wet or dry etching methods, thus forming the structure shown in FIG. 5. If a mating recess 18 with a contact pad 20 is to be formed instead of a projecting connective element 14, step four involves partially etching back the conductive accumulation 38 to the exclusion of the passivation layer 26 using conventional wet or dry etching methods, thus forming the structure shown in FIG. 6. By partially etching back the conductive accumulation 38, a conductive contact pad 20 will remain at the bottom of the mating recess 18 to aid ultimately in effecting connection of the die to the substrate.

Figure 7:
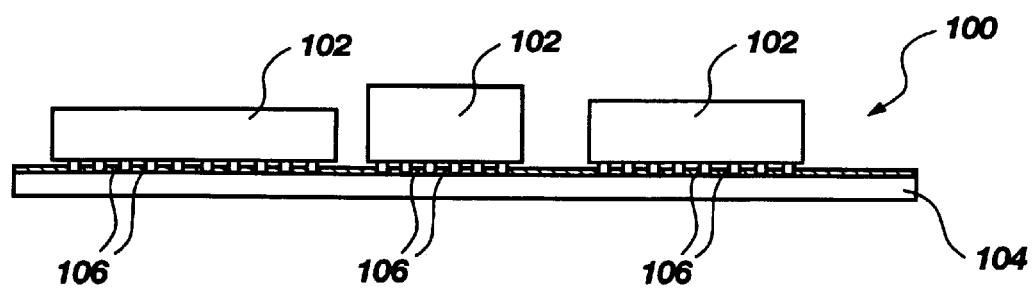
FIG. 7 is a schematic, side partial cross-sectional view of a multichip module according to the present invention.
Figure 8:
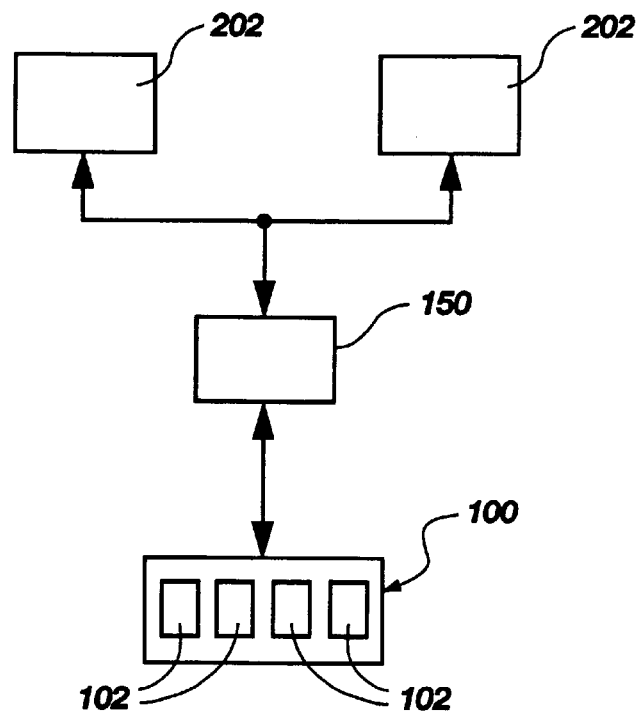
FIG. 8 is a schematic of a computer system including devices formed according to the present invention.

It is contemplated that the present invention will prove suitable for the fabrication of multi-chip modules (MCMs), including SIMMs, DIMMs, TRIMMs and other memory cards, as well as motherboards and other MCMs including dice having other functions, including microprocessors and logic dice, as well as application-specific integrated circuits (ASICs). A schematic, side elevation of an MCM 100 including three dice 102 connected to a substrate 104 according to mating connections 106 of the present invention is depicted in FIG. 7. Likewise, as depicted in FIG. 8, an MCM such as an exemplary DIMM 100 including dice 102 may be associated with a separate microprocessor 150 in combination with an input device 200 and an output device 202, such as is the case in a personal computer.

The connective element and mating recessed contact pad of the present invention, and the described method for forming them, offer significant advantages over conventional flip-chip solder bumps and solder bumping methods. Most notably, the present invention allows the formation of a dense, precisely dimensionally-controlled (as to height, width and pitch) array of connections at low cost. First, an array of elements or recesses on a die or substrate may be formed at the wafer-scale level such that, once processing of the wafer is complete, the dice may be separated with their connective structures (projecting or recessed) already in place. Understandably, while conventional screen printing methods may also be used to deposit discrete solder bumps on dice at the wafer-scale level, such screen-printed solder bumps are, however, limited to a semi-spherical shape and to a comparatively large pitch because of the required first reflow and the precision limits of screen-printing. Very small bumps are difficult to deposit with precision using screen-printing technology because of the inherently poor resolution. Electroplating methods may be used to overcome the precision limits of screen printing, but cannot presently be conducted at the wafer-scale level; to electroplate solder bumps, the wafer must first be separated into dice. Electroplating, moreover, adds additional time, process steps and materials beyond that required by the present invention, and thus adds to manufacturing and waste disposal costs. The present invention allows highly precise placing and sizing of flip-chip connections without all the etchants, electroplating solutions, and resist layers needed to electroplate solder bumps. Specifically, the present invention uses only a single mask in the four step process (to pattern the passivation layer with holes for connective elements) and is suitable for the use of relatively rapid and simple abrasive planarization and dry etchback techniques, rather than more complex, slow and costly electroplating and wet etching.

It is also notable that the present invention provides a self-aligning feature and well-controlled height of the connective element, the latter due to the use of the previously-maintained abrasive or CMP planarizing techniques to remove the conductive material in a precisely-controlled manner. Pillar-shaped, high aspect ratio conductive connective elements of almost any desired height or geometric cross-section may be formed to easily align with mating recesses on a substrate. Uniform heights and uniform cross sections for all of the projecting and recessed connective elements in mating arrays ensure complete electrical, mechanical and thermal connection of each opposing pair of pads on the die and substrate. Absent such uniformity, some prior art connective elements may form a complete connection to their cooperating pads, while others may not with no particular predictability.

The well-controlled element height also ensures that any desired vertical gap width is maintained between the die and substrate. When connective elements on the die are formed from solder or other reflowable material, it may be desirable to provide insulative spacers of some type on either die or substrate, as shown in broken lines 40 in FIG. 1, to guarantee desired vertical spacing. That is, upon reflow, a pillar will most likely deform to fill the mating recess and correspondingly collapse somewhat. By providing spacers 40 in areas of the die/substrate interface not populated with connecting elements and recessed contacts, collapse of one component toward another is prevented even if the connective elements are of limited compressive strength.

The present invention has been disclosed in terms of certain preferred embodiments as illustrated and described herein. However, those of ordinary skill in the art will recognize and appreciate that it is not so limited, and that many additions, deletions and modifications to, and combinations of, the disclosed embodiments may be effected without departing from the scope of the invention as hereinafter claimed.

What is claimed is:

1. A method for forming at least one discrete connective element for flip-chip connection of a semiconductor die, comprising:
providing at least one semiconductor die having a surface with at least one bond pad placed thereon;
forming at least one passivation layer to a predetermined thickness over the at least one bond pad and the die surface surrounding the at least one bond pad;
selectively removing a portion of the at least one passivation layer to form at least one aperture therethrough exposing at least part of the at least one bond pad;
depositing a layer of conductive material over the at least one passivation layer and into the at least one aperture formed therethrough to substantially fill the at least one aperture and contact the at least one bond pad;
removing the conductive material layer above the at least one passivation layer by a first process to expose an uppermost surface of the at least one passivation layer to provide an upper surface of conductive material within the at least one aperture generally flush with the exposed uppermost surface of the at least one passivation layer and to retain the predetermined thickness of the at least one passivation layer over the die surface; and
reducing the predetermined thickness of the at least one passivation layer by a second differing process to define at least one discrete connective element from deposited conductive material projecting above the at least one passivation layer.

2. The method of claim 1, wherein said at least one semiconductor die comprises a plurality of unsingulated semiconductor dice in wafer form.

3. The method of claim 1, wherein said at least one semiconductor die is selected from the group comprising a memory die, a processor die, and a logic die.

4. The method of claim 1, wherein forming said at least one passivation layer comprises forming a plurality of passivation layers.

5. The method of claim 4, further comprising forming at least one of said plurality of passivation layers from a low wettability material to remain as an exposed overlayer surrounding the discrete connective element.

6. The method of claim 1, wherein said depositing of conductive said material is performed using a method selected from the group comprising sputtering, chemical vapor deposition, and spin coating.

7. The method of claim 1, wherein said conductive material is selected from the group consisting of metal, thermoplastic conductive epoxy, thermosetting conductive epoxy, conductive B-stage epoxy, and conductive snap-cure epoxy.

8. The method of claim 1, wherein said removing the conductive material by a first process is performed using a process selected from the group consisting of abrasive planarization, chemical-mechanical planarization, and plasma etching.

9. The method of claim 1, further comprising depositing an overlayer of low wettability material on the at least one passivation layer prior to depositing the conductive material.

10. The method of claim 1, wherein said at least one bond pad comprises a plurality of bond pads arranged in an array and the at least one discrete connective element comprises a plurality of discrete connective elements, each of said connective elements of said plurality being associated with a bond pad.

11. The method of claim 1, further comprising depositing an intermediate conductive layer over the passivation layer prior to deposition of the conductive material, and wherein removing the conductive material above the passivation layer by a first process includes removing the intermediate conductive layer thereabove.

12. The method of claim 11, wherein the intermediate conductive layer deposition is conducted after formation of the aperture, and the intermediate conductive layer is deposited over the at least one bond pad, and wherein removing the conductive material above the passivation layer by a first process includes removing the intermediate conductive layer thereabove.

13. The method of claim 1, wherein said conductive material is heat-softenable, and further including heating the conductive material in a pre-reflow step prior to removing the conductive material above the passivation layer.

14. The method of claim 1, wherein said reducing the predetermined thickness of the at least one passivation layer by a second differing process is performed using a process selected from the group consisting of wet etching and dry etching.

15. A method for fabricating a self-aligning flip-chip semiconductor assembly, comprising:
providing at least one semiconductor die having a surface with at least one bond pad placed thereon;
forming at least one passivation layer to a predetermined thickness over the at least one bond pad and the die surface surrounding the at least one bond pad;
selectively removing a portion of the at least one passivation layer to form at least one aperture therethrough exposing at least part of the at least one bond pad;
depositing a layer of conductive material over the at least one passivation layer and into the at least one aperture to substantially fill the at least one aperture and contact the at least one bond pad;
removing the conductive material layer above the at least one passivation layer by a first process to expose an uppermost surface of the at least one passivation layer to provide an upper surface of conductive material within the at least one aperture generally flush with the exposed uppermost surface of the at least one passivation layer and to retain the predetermined thickness of the at least one passivation layer over the die surface;
reducing the predetermined thickness of the at least one passivation layer by a second differing process to define at least one discrete connective element from the deposited conductive material projecting from the at least one passivation layer;
providing a semiconductor die assembly component having a surface with at least one conductive pad placed thereon;
forming at least one passivation layer to a thickness covering the at least one conductive pad and the component surface surrounding the at least one conductive pad;
removing a portion of the at least one passivation layer covering said at least one conductive pad to form at least one aperture therethrough exposing at least a portion of the at least one conductive pad;
depositing a layer of conductive material over the at least one passivation layer covering said at least one conductive pad and into the at least one aperture to contact the at least one conductive pad;
removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact;
removing the conductive material in the at least one aperture to a level below an upper surface of the at least one passivation layer covering the at least one conductive pad to form at least one recess having a conductive contact therein; and
inserting the at least one discrete connective element into the at least one recess to effect electrical contact with the conductive contact therein.

16. The method of claim 15, wherein said semiconductor assembly component is selected from the group comprising a semiconductor die, a semiconductor wafer, and a carrier substrate.

17. The method of claim 16, wherein said flip-chip semiconductor assembly is selected from the group comprising a die and substrate assembly and a multichip module.

18. The method of claim 15, wherein forming said at least one passivation layer comprises forming a plurality of passivation layers.

19. The method of claim 18, further comprising forming at least one of said plurality of passivation layers from a low wettability material to remain as an exposed overlayer surrounding the discrete connective element.

20. The method of claim 15, wherein said depositing of conductive material is performed using a method selected from the group comprising sputtering, chemical vapor deposition, and spin coating.

21. The method of claim 15, wherein said conductive material is selected from the group consisting of metal, thermoplastic conductive epoxy, thermosetting conductive epoxy, conductive B-stage epoxy, and conductive snap-cure epoxy.

22. The method of claim 15, wherein said removal of conductive material by a first process is performed using a process selected from the group consisting of abrasive planarization, chemical-mechanical planarization, and plasma etching.

23. The method of claim 15, further comprising depositing an overlayer of low wettability material on at least one passivation layer prior to depositing conductive material thereover.

24. The method of claim 15, wherein said at least one conductive pad comprises a plurality of conductive pads arranged in an array and the at least one discrete connective element comprises a plurality of discrete connective elements, each of said connective elements of said plurality being associated with a bond pad.

25. The method of claim 15, further comprising depositing an intermediate conductive layer over the passivation layer of at least one of the at least one semiconductor die and the at least one semiconductor die assembly component prior to deposition of the conductive material on the at least one passivation layer, and removing the conductive material above the passivation layer by a first process includes removing the intermediate conductive layer above that passivation layer.

26. The method of claim 15, wherein the intermediate conductive layer deposition is conducted after formation of the aperture in that passivation layer, and the intermediate conductive layer is deposited into the aperture therein, and wherein removing the conductive material above that passivation layer by a first process includes removing the intermediate conductive layer thereabove.

27. The method of claim 15, wherein conductive material deposited on at least one of said semiconductor die and said semiconductor die assembly component is heat-softenable, and further including heating that conductive material in a pre-reflow step prior to removing the conductive material above the passivation layer.

28. The method of claim 15, wherein said reducing the predetermined thickness of the at least one passivation layer by a second differing process is performed using a process selected from the group consisting of wet etching and dry etching.

29. A method for forming at least one discrete connective element for flip-chip connection of a semiconductor die, comprising:

providing at least one semiconductor die having a surface with at least one bond pad placed thereon;

forming at least one passivation layer to a thickness over the at least one bond pad and the die surface surrounding the at least one bond pad;

depositing an intermediate conductive layer over the at least one passivation layer;

selectively removing portions of the intermediate conductive layer and the at least one passivation layer to form at least one aperture therethrough exposing at least part of the at least one bond pad;

depositing a conductive material over the intermediate conductive layer and substantially filling the at least one aperture;

removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact;

reducing the thickness of the at least one passivation layer to define at least one discrete connective element of substantially uniform width from deposited conductive material projecting above the at least one passivation layer.

30. A method for forming at least one discrete connective element for flip-chip connection of a semiconductor die, comprising:

providing at least one semiconductor die having a surface with at least one bond pad placed thereon;

forming at least one passivation layer to a thickness over the at least one bond pad and the die surface surrounding the at least one bond pad;

selectively removing a portion of the at least one passivation layer to form at least one aperture therethrough exposing at least part of the at least one bond pad;

depositing an intermediate conductive layer over the at least one passivation layer and into the at least one aperture to contact an exposed part of the at least one bond pad;

depositing a conductive material over the intermediate conductive layer and substantially filling the at least one aperture;

removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact; and reducing the thickness of the at least one passivation layer to define at least one discrete connective element from deposited conductive material and intermediate conductive layer projecting above the at least one passivation layer.

31. The method of claim 30, wherein said at least one semiconductor die comprises a plurality of unsingulated semiconductor dice in wafer form.

32. The method of claim 30, wherein said at least one semiconductor die is selected from the group comprising a memory die, a processor die, and a logic die.

33. The method of claim 30, wherein forming said at least one passivation layer comprises forming a plurality of passivation layers.

34. The method of claim 33, further comprising forming at least one of said plurality of passivation layers from a low wettability material to remain as an exposed overlayer surrounding the discrete connective element.

35. The method of claim 30, wherein said depositing of said conductive material is performed using a method selected from the group comprising sputtering, chemical vapor deposition, and spin coating.

36. The method of claim 30, wherein said conductive material is selected from the group consisting of metal, thermoplastic conductive epoxy, thermosetting conductive epoxy, conductive B-stage epoxy, and conductive snap-cure epoxy.

37. The method of claim 30, wherein said removing the conductive material is performed using a method selected from the group comprising abrasive planarization, chemical-mechanical planarization, and plasma etching.

38. The method of claim 30, further comprising depositing an overlayer of low wettability material on the at least one passivation layer prior to depositing the conductive material.

39. The method of claim 30, wherein said at least one bond pad comprises a plurality of bond pads arranged in an array and the at least one discrete connective element comprises a plurality of discrete connective elements, each of said connective elements of said plurality being associated with a bond pad.

40. The method of claim 30, wherein said conductive material is heat-softenable, and further including heating the conductive material in a pre-reflow step prior to removing the conductive material above the passivation layer.

41. A method for forming a discrete connective recess for flip-chip connection of a semiconductor assembly component, comprising:

providing a semiconductor assembly component having a surface with at least one conductive pad placed thereon;

forming at least one passivation layer to a thickness covering the conductive pad and the assembly component surface surrounding the at least one conductive pad;

depositing an intermediate conductive layer over the at least one passivation layer;

removing portions of the intermediate conductive layer and the at least one passivation layer to form at least one aperture therethrough exposing at least a portion of the at least one conductive pad;

depositing a conductive material over the intermediate conductive layer and substantially filling the at least one aperture;

removing the conductive material and the intermediate conductive layer above the at least one passivation layer to form a substantially flat exposed surface; and removing the conductive material in the aperture to a level below an upper surface of the at least one passivation layer to form a recessed conductive contact.

42. A method for fabricating a self-aligning flip-chip semiconductor assembly, comprising:

providing at least one semiconductor die having a surface with at least one bond pad placed thereon;

forming at least one passivation layer to a thickness over the at least one bond pad and the die surface surrounding the at least one bond pad;

depositing an intermediate conductive layer over the at least one passivation layer;

selectively removing portions of the intermediate conductive layer and the at least one passivation layer to form at least one aperture therethrough exposing at least part of the at least one bond pad;

depositing a conductive material over the intermediate conductive layer and substantially filling the at least one aperture;

removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact;

reducing the thickness of the at least one passivation layer to define at least one discrete connective element from the deposited conductive material projecting from the at least one passivation layer;

providing a semiconductor die assembly component having a surface with at least one conductive pad placed thereon;

forming at least one passivation layer to a thickness covering the at least one conductive pad and the surface surrounding the at least one conductive pad;

depositing an intermediate conductive layer over the at least one passivation layer covering the conductive pad;

removing a portion of the at least one passivation layer and the intermediate conductive layer to form at least one aperture therethrough exposing at least a portion of the at least one conductive pad;

depositing a conductive material over the at least one passivation layer covering the at least one conductive pad and substantially filling the at least one aperture;

removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact;

removing the conductive material in the at least one aperture to a level below an upper surface of the at least one passivation layer to form at least one recess conductive contact therein; and inserting the at least one discrete connective element into the at least one recess to effect electrical contact with the conductive contact therein.

43. A method for fabricating a self-aligning flip-chip semiconductor assembly, comprising:

providing at least one semiconductor die having a surface with at least one bond pad placed thereon;

forming at least one passivation layer to a thickness over the at least one bond pad and the die surface surrounding the at least one bond pad;

selectively removing a portion of the at least one passivation layer to form at least one aperture in the at least one passivation layer exposing at least part of the at least one bond pad;

depositing an intermediate conductive layer over the at least one passivation layer and into the at least one aperture such that the intermediate conductive layer contacts the at least partially exposed portion of the at least one bond pad;

depositing a conductive material over the intermediate conductive layer and substantially filling the at least one aperture;

removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact;

reducing the thickness of the at least one passivation layer to define at least one discrete connective element from the deposited conductive material and intermediate conductive layer projecting from the at least one passivation layer;

providing a semiconductor die assembly component having a surface with at least one conductive pad placed thereon;

forming at least one passivation layer to a thickness covering the conductive pad and the surface surrounding the at least one conductive pad;

removing a portion of the at least one passivation layer to form an aperture in the at least one passivation layer exposing at least a portion of the at least one conductive pad;

depositing an intermediate conductive layer over the at least one passivation layer covering the conductive pad and into the at least one aperture formed therethrough to contact an exposed portion of the at least one conductive pad;

depositing a conductive material over the at least one passivation layer over the surface having the at least one conductive pad and substantially filling the at least one aperture;

removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact;

removing at least the conductive material in the at least one aperture to a level below an upper surface of the at least one passivation layer to form at least one recess having a conductive contact therein; and inserting the at least one discrete connective element into the at least one recess to effect electrical contact with the conductive contact therein.

44. The method of claim 43, wherein said semiconductor assembly component is selected from the group comprising a semiconductor die, a semiconductor wafer, and a carrier substrate.

45. The method of claim 44, wherein said flip-chip semiconductor assembly is selected from the group comprising a die and substrate assembly and a multichip module.

46. The method of claim 43, wherein forming said at least one passivation layer comprises forming a plurality of passivation layers.

47. The method of claim 46, further comprising forming at least one of said plurality of passivation layers from a low wettability material to remain as an exposed overlayer surrounding the discrete connective element.

48. The method of claim 43, wherein said depositing of conductive material is performed using a method selected from the group comprising sputtering, chemical vapor deposition, and spin coating.

49. The method of claim 43, wherein said conductive material is selected from the group consisting of metal, thermoplastic conductive epoxy, thermosetting conductive epoxy, conductive B-stage epoxy, and conductive snap-cure epoxy.

50. The method of claim 43, wherein said removal of conductive material is performed using a method selected from the group comprising abrasive planarization, chemical-mechanical planarization, and plasma etching.

51. The method of claim 43, further comprising depositing an overlayer of low wettability material on at least one passivation layer prior to depositing conductive material thereover.

52. The method of claim 43, wherein said at least one conductive pad comprises a plurality of conductive pads arranged in an array and the at least one discrete connective element comprises a plurality of discrete connective elements, each of said connective elements of said plurality being associated with a bond pad.

53. The method of claim 43, wherein conductive material deposited on at least one of said semiconductor die and said semiconductor die assembly component is heat-softenable, and further including heating that conductive material in a pre-reflow step prior to removing the conductive material above the passivation layer.

54. A method for forming at least one discrete connective element for flip-chip connection of a semiconductor die, comprising:

providing at least one semiconductor die having a surface with at least one bond pad placed thereon;

forming at least one passivation layer to a thickness over the at least one bond pad and the die surface surrounding the at least one bond pad;

selectively removing a portion of the at least one passivation layer to form at least one aperture therethrough exposing at least part of the at least one bond pad;

depositing an intermediate layer of conductive material over the at least one passivation layer and into the at least one aperture formed therethrough and over the at least one bond pad;

depositing a layer of conductive material over the at least one passivation layer and into the at least one aperture formed therethrough to substantially fill the at least one aperture and contact the intermediate layer of conductive material over the at least one bond;

removing the conductive material layer above the at least one passivation layer to expose an uppermost surface of the at least one passivation layer to provide an upper surface of conductive material within the at least one aperture generally flush with the exposed uppermost surface of the at least one passivation layer and to leave the at least one passivation layer substantially intact; and reducing the thickness of the at least one passivation layer to define at least one discrete connective element from deposited conductive material projecting above the at least one passivation layer.

55. The method of claim 54, wherein said at least one semiconductor die comprises a plurality of unsingulated semiconductor dice in wafer form.

56. The method of claim 54, wherein said at least one semiconductor die is selected from the group comprising a memory die, a processor die, and a logic die.

57. The method of claim 54, wherein forming said at least one passivation layer comprises forming a plurality of passivation layers.

58. The method of claim 57, further comprising forming at least one of said plurality of passivation layers from a low wettability material to remain as an exposed overlayer surrounding the discrete connective element.

59. The method of claim 54, wherein said depositing of said conductive material is performed using a method selected from the group comprising sputtering, chemical vapor deposition, and spin coating.

60. The method of claim 54, wherein said conductive material is selected from the group consisting of metal, thermoplastic conductive epoxy, thermosetting conductive epoxy, conductive B-stage epoxy, and conductive snap-cure epoxy.

61. The method of claim 54, wherein said removing the conductive material is performed using a method selected from the group comprising abrasive planarization, chemical-mechanical planarization, and plasma etching.

62. The method of claim 54, further comprising depositing an overlayer of low wettability material on the at least one passivation layer prior to depositing the conductive material.

63. The method of claim 54, wherein said at least one bond pad comprises a plurality of bond pads arranged in an array and the at least one discrete connective element comprises a plurality of discrete connective elements, each of said connective elements of said plurality being associated with a bond pad.

64. The method of claim 54, wherein said conductive material is heat-softenable, and further including heating the conductive material in a pre-reflow step prior to removing the conductive material above the passivation layer.

\* \* \* \* \*

UNITED STATES PATENT AND TRADEMARK OFFICE
CERTIFICATE OF CORRECTION

| | | |
|---|---|---|
| PATENT NO. | : 6,245,594 B1 | |
| APPLICATION NO. | : 08/906297 | |
| DATED | : June 12, 2001 | |
| INVENTOR(S) | : Zhiqiang Wu, Tongbi Jiang and Salman Akram | |

It is certified that error appears in the above-identified patent and that said Letters Patent is hereby corrected as shown below:

In the drawings:

In FIG. 8,      change the left-hand occurrence of reference numeral "202" to --200--

In the claims:

CLAIM 26,     COLUMN 12,   LINE 47,     change "The method of claim 15," to --The method of claim 25,--

CLAIM 54,     COLUMN 17,   LINE 39,     change "at least one bond;" to --at least one bond pad;--

UNITED STATES PATENT AND TRADEMARK OFFICE
CERTIFICATE OF CORRECTION

PATENT NO.         : 6,245,594 B1                                          Page 2 of 2
APPLICATION NO. : 08/906297
DATED              : June 12, 2001
INVENTOR(S)        : Zhiqiang Wu, Tongbi Jiang and Salman Akram It is certified that error appears in the above-identified patent and that said Letters Patent is hereby corrected as shown below:

Please replace FIG. 8 with the following amended figure:

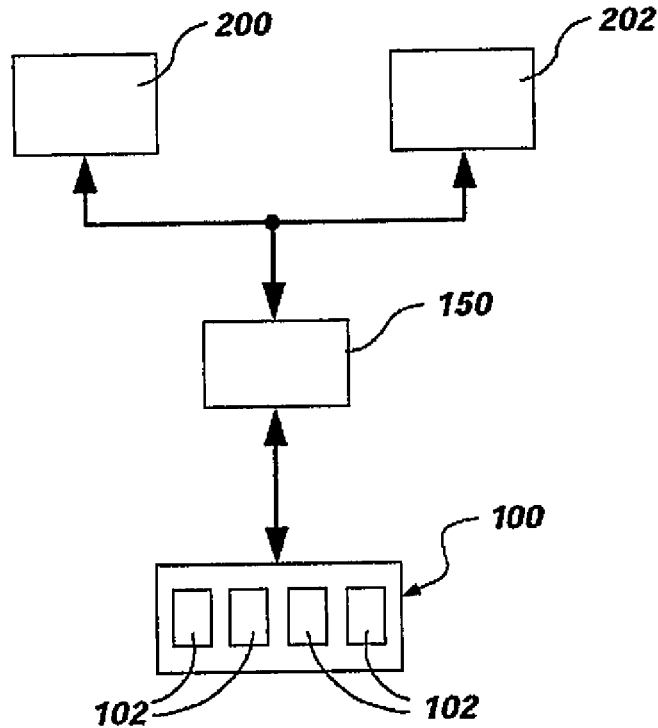

Fig. 8

Signed and Sealed this

Fourth Day of September, 2007

JON W. DUDAS
*Director of the United States Patent and Trademark Office*